United States Patent
Heuel et al.

(10) Patent No.: US 10,684,356 B2
(45) Date of Patent: Jun. 16, 2020

(54) METHOD FOR ANALYZING THE RESOLUTION AND/OR THE ACCURACY OF A TRANSMISSION UNIT AND RADAR SENSOR

(71) Applicant: Rohde & Schwarz GmbH & Co. KG, Munich (DE)

(72) Inventors: Steffen Heuel, Munich (DE); Andreas Lagler, Rosenheim (DE); Darren Tipton, Reading (GB)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 326 days.

(21) Appl. No.: 15/293,030

(22) Filed: Oct. 13, 2016

(65) Prior Publication Data
US 2018/0106888 A1 Apr. 19, 2018

(51) Int. Cl.
G01S 7/40 (2006.01)
G01S 13/34 (2006.01)
H03C 3/08 (2006.01)

(52) U.S. Cl.
CPC .......... *G01S 7/4056* (2013.01); *G01S 7/4008* (2013.01); *G01S 13/34* (2013.01); *H03C 3/08* (2013.01); *G01S 2007/406* (2013.01); *G01S 2007/4065* (2013.01); *G01S 2007/4069* (2013.01)

(58) Field of Classification Search
CPC ........... G01S 2007/2883; G01S 13/282; G01S 7/415; G01S 13/28; G01S 13/88; G01S 13/931; G01S 7/023; G01S 2007/356; G01S 7/354; G01S 7/4052; G01S 2007/358; G01S 7/352; G01S 7/4021; G01S 7/4004; G01S 2007/4065; G01S 7/4056; G01S 13/34; G01S 13/36; G01S 7/40; G01S 7/4008; G01S 7/41; G01S 7/411; G01S 13/584; G01S 2013/93271; G01S 13/04; G01S 2013/93272; G01S 2013/9315; G01S 2013/93274; G01S 2013/93275; G01S 13/726; G01S 13/582; G01S 13/50; G01S 2007/4069; G01S 2007/406; H03C 3/08
See application file for complete search history.

(56) References Cited

U.S. PATENT DOCUMENTS 4,206,508 A * 6/1980 Lehmann ................ F41G 7/001
114/23
4,683,473 A * 7/1987 Haugland ............. G01S 7/4052
342/15
5,457,463 A * 10/1995 Vencel .................. G01S 7/4052
342/169

(Continued)

*Primary Examiner* — Olumide Ajibade Akonai
(74) *Attorney, Agent, or Firm* — Schwabe, Williamson & Wyatt, P.C.

(57) ABSTRACT

A method for analyzing the resolution and/or the accuracy of a transmission unit of a radar sensor is described wherein a transmitter signal is received via a receiving unit. At least one echo signal based on said received signal is simulated. The frequency difference of said transmitter signal and said echo signal is determined. Said frequency difference is filtered and transformed in order to obtain a transform. At least one maximum of said frequency difference in said transform is detected. Spectral properties of said frequency difference in said transform are determined. At least one quality parameter of said spectral properties is outputted. Further, a radar sensor is described.

15 Claims, 3 Drawing Sheets

(56) References Cited

U.S. PATENT DOCUMENTS

| | | | | |
|---|---|---|---|---|
| 6,496,139 | B1* | 12/2002 | Flacke | G01S 7/4052 |
| | | | | 342/165 |
| 7,705,773 | B2* | 4/2010 | Vacanti | G01S 7/35 |
| | | | | 342/169 |
| 10,175,342 | B2* | 1/2019 | McCaughey | G01S 7/414 |
| 2015/0084808 | A1* | 3/2015 | Vacanti | G01S 7/41 |
| | | | | 342/122 |
| 2016/0087734 | A1* | 3/2016 | Kordik | H04B 17/0085 |
| | | | | 455/67.14 |
| 2016/0173165 | A1* | 6/2016 | Choi | H04B 1/525 |
| | | | | 455/78 |
| 2016/0299215 | A1* | 10/2016 | Dandu | G01S 7/4008 |
| 2017/0242118 | A1* | 8/2017 | Vacanti | G01S 13/343 |
| 2018/0136323 | A1* | 5/2018 | Pozdniakov | G01S 7/35 |

* cited by examiner

METHOD FOR ANALYZING THE RESOLUTION AND/OR THE ACCURACY OF A TRANSMISSION UNIT AND RADAR SENSOR

TECHNICAL FIELD

The invention relates to a method for analyzing the resolution and/or the accuracy of a transmission unit of a radar sensor as well as a radar sensor.

BACKGROUND OF THE INVENTION

In the state of the art, it is known to measure a transmitter signal of a transmission unit of a radar sensor in order to obtain a received signal, in particular measuring and analyzing a linear modulated continuous wave emitted by the transmission unit.

This received signal may be shown in a spectrogram, also called a frequency-time area or a frequency-time plane, wherein the frequency of the signal received is illustrated with respect to the time in order to verify a time dependency of the frequency. Usually, the received signal is compared with a perfect line in order to determine its deviation with respect to that perfect line corresponding to a perfect linear modulated continuous wave, for instance. Accordingly, the linearity of the received signal as well as its deviation can be determined easily.

The result obtained is a frequency deviation with respect to the time as it is taken from the spectrogram.

However, the results obtained by such a comparison do not provide any information regarding the resolution and/or the accuracy of the transmitter signal, in particular the transmission unit of the radar sensor.

Since the resolution and/or the accuracy are important parameters in order to determine the quality of the transmission unit, it is desired to have the possibility to gather this information in an easy and simply manner.

SUMMARY OF THE INVENTION

The invention provides a method for analyzing the resolution and/or the accuracy of a transmission unit of a radar sensor comprising the following steps:
a) Receiving a transmitter signal via a receiving unit,
b) Simulating at least one echo signal based on said received signal,
c) Determining the frequency difference of said transmitter signal and said echo signal,
d) Filtering and transforming said frequency difference in order to obtain a transform, in particular using Fourier transformation in order to obtain a Fourier transform,
e) Detecting at least one maxima of said frequency difference in said transform,
f) Determining spectral properties of said frequency difference in said transform, and
g) Outputting at least one quality parameter of said spectral properties as an output value.

The invention is based on the finding that the resolution and accuracy can be obtained in an easy manner by using the frequency difference for determining its spectral properties and the quality parameter. Thus, the quality of the transmission unit can be verified easily. For instance, the frequency difference may be shown in a spectrogram (frequency-time area or frequency-time plane) wherein the frequency difference is illustrated with respect to the time. Generally, the frequency difference is also called beat frequency. As the echo signal is simulated, the beat frequency is a synthetic one. Thus, the synthetic beat frequency is produced by delaying, particularly runtime shifting, and frequency shifting said received signal, and particularly wherein the received signal may be Doppler shifted. Afterwards, a frequency bin width of said transform is analyzed in order to determine the spectral properties in order to gather information about the quality of the transmission unit. Therefore, the outputted quality parameter being the output value may be the resolution and/or the accuracy.

Generally, the accuracy and/or resolution can be obtained in range and frequency, in particular Doppler frequency.

According to an aspect, said echo signal is processed with at least one simulation of a processing unit of said receiving unit. Thus, it is ensured that the simulated echo signal is processed in an equal manner as the received signal which is processed by the real processing unit of the receiving unit. For instance, the processing unit can be used to simulate itself for simulation purposes. Accordingly, the processing unit may be the main component.

Particularly, several different echo signals are simulated wherein several different frequency differences are determined for said several different echo signals. Several different time shifts and different frequency shifts are applied to the received signal in order to obtain the several different echo signals being simulated.

According to another aspect, said transmission unit and said receiving unit are housed in said radar sensor, in particular a continuous wave radar sensor. Thus, all components are housed within the radar sensor which is a compact device. Moreover, the radar sensor may be a frequency modulated continuous wave radar sensor.

Furthermore, the resolution and/or the accuracy may be analyzed depending on said transmitter signal. Since the frequency and time shifts for the simulated echo signals are applied on the measured transmitter signal being the received signal, the information is gathered depending on the transmitter signal itself. A different transmitter signal relates to a different received signal which in turn provides a differently simulated echo signal.

Particularly, the time, the frequency offset, the amplitude and/or the addition of noise are considered during the simulation. All these parameters or aspects are usually influenced when the transmitter signal is reflected by an object to be detected wherein the reflected transmitter signal is received by the receiving unit.

According to another aspect, said echo signal is mixed down by said transmitter signal in order to obtain said frequency difference. The transmitter signal defines an instantaneous frequency which is used to mix down the echo signal for further processing, in particular filtering and transforming. Mixing down is also called down converting.

Particularly, said spectral properties comprise the full width at half maximum, the amplitude, the distance between at least two maxima, the steepness, the standard deviation, the mean value and/or the deviation from a preset. The full width at half maximum is also called half width. The mentioned parameters are the most important spectral properties which can be easily determined by the method. Furthermore, these parameters can be used to identify the quality parameter, in particular the resolution and/or the accuracy.

Furthermore, said echo signal may be preset as a position setting for the frequency difference. The echo signal can be preset such that the frequency difference is located at a desired position which is of interest regarding the resolution and/or accuracy of the transmission unit.

According to another aspect, said processing unit decodes said frequency difference. Thus, information about the transmitter signal as well as the received signal can be obtained as long as the received signal has been reflected by an object previously.

Particularly, said output value is a length specification. Thus, the quality parameter outputted has the unit of length which corresponds to the unit of the radar sensor. In other words, the unit of the quality parameter is meter (m), centimeter (cm) or millimeter (mm). Thus, the quality can be recognized easily for the user.

According to another aspect, said accuracy and/or said resolution of said echo signal is compared with an ideal frequency modulated continuous wave chirp. Thus, the quality of the accuracy and/or the resolution of the transmitter signal can be determined easily as it is compared with the ones of an ideal chirp signal, in particular a linear one.

The invention further provides a radar sensor comprising a receiving unit, a transmission unit and a processing unit, said transmission unit is configured to transmit a transmitter signal, said receiving unit being configured to receive said transmitter signal and said processing unit being configured to simulate at least one echo signal based on said received signal and wherein said processing unit is configured to output at least one quality parameter of spectral properties. Thus, the radar sensor can simulate echo signals in order to determine at least one quality parameter of spectral properties.

According to an aspect, said radar sensor is configured to execute a method as mentioned above. Thus, the quality parameter can be obtained by only one device, namely the radar sensor. The radar sensor has the further advantages mentioned above.

According to another aspect, said radar sensor is at least part of a continuous wave radar system, in particular a frequency-modulated continuous wave radar system emitting linear modulated continuous waves, for instance. Moreover, said radar sensor is a continuous wave radar sensor, in particular a frequency-modulated continuous wave radar sensor. For instance, the radar sensor can emit a linear modulated continuous wave.

Generally, such a radar sensor may be an automotive radar sensor which is used for testing at least one automotive part which corresponds to the object to be detected. Accordingly, the method is used in order to measure and analyze the quality of the radar sensor, in particular its transmission unit. Hence, the method may also be applied for automotive purposes.

BRIEF DESCRIPTION OF DRAWINGS

The invention will now be described with reference to an exemplary embodiment which is shown in the enclosed drawings. In the drawings, FIG. 1 schematically shows a radar sensor according to the invention.

DETAILED DESCRIPTION

Figure 1:
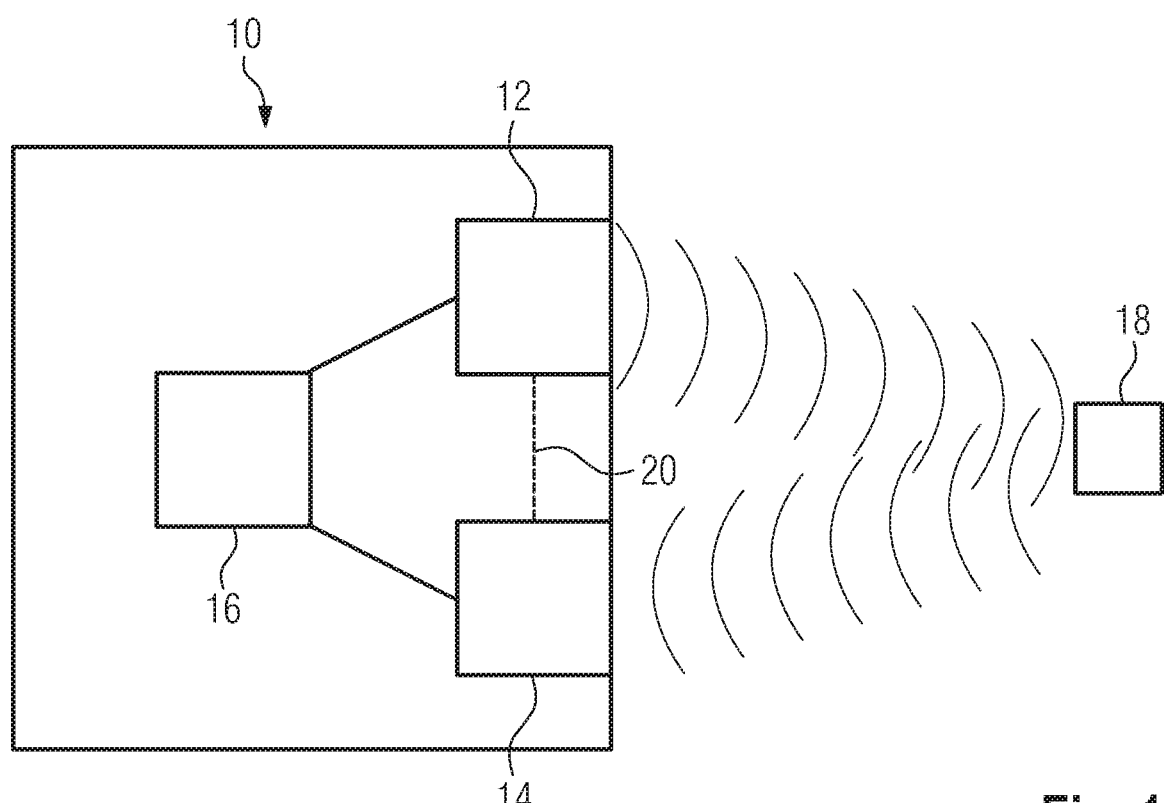

In FIG. 1, a radar sensor 10 is schematically shown which comprises a transmission unit 12, a receiving unit 14 and a processing unit 16.

Alternatively, the radar sensor 10 comprises the processing unit 16 and a transceiver replacing the transmission unit 12 and the receiving unit 14. In other words, the transmission unit 12 and the receiving unit 14 may be formed in one piece having both transmission and receiving functions.

In the shown embodiment, the transmission unit 12, the receiving unit 14 and the processing unit 16 are mutually housed within a housing of the radar sensor 10.

Further, the radar sensor 10 may be a continuous wave radar sensor, in particular a frequency modulated continuous wave radar sensor. Accordingly, the radar sensor 10 is part of a radar system, in particular a continuous wave radar system; preferably a frequency modulated continuous wave radar system.

Generally, the radar sensor 10 is configured to execute a method which is illustrated in the flow-chart shown in FIG. 2 which is described hereinafter.

Figure 2:
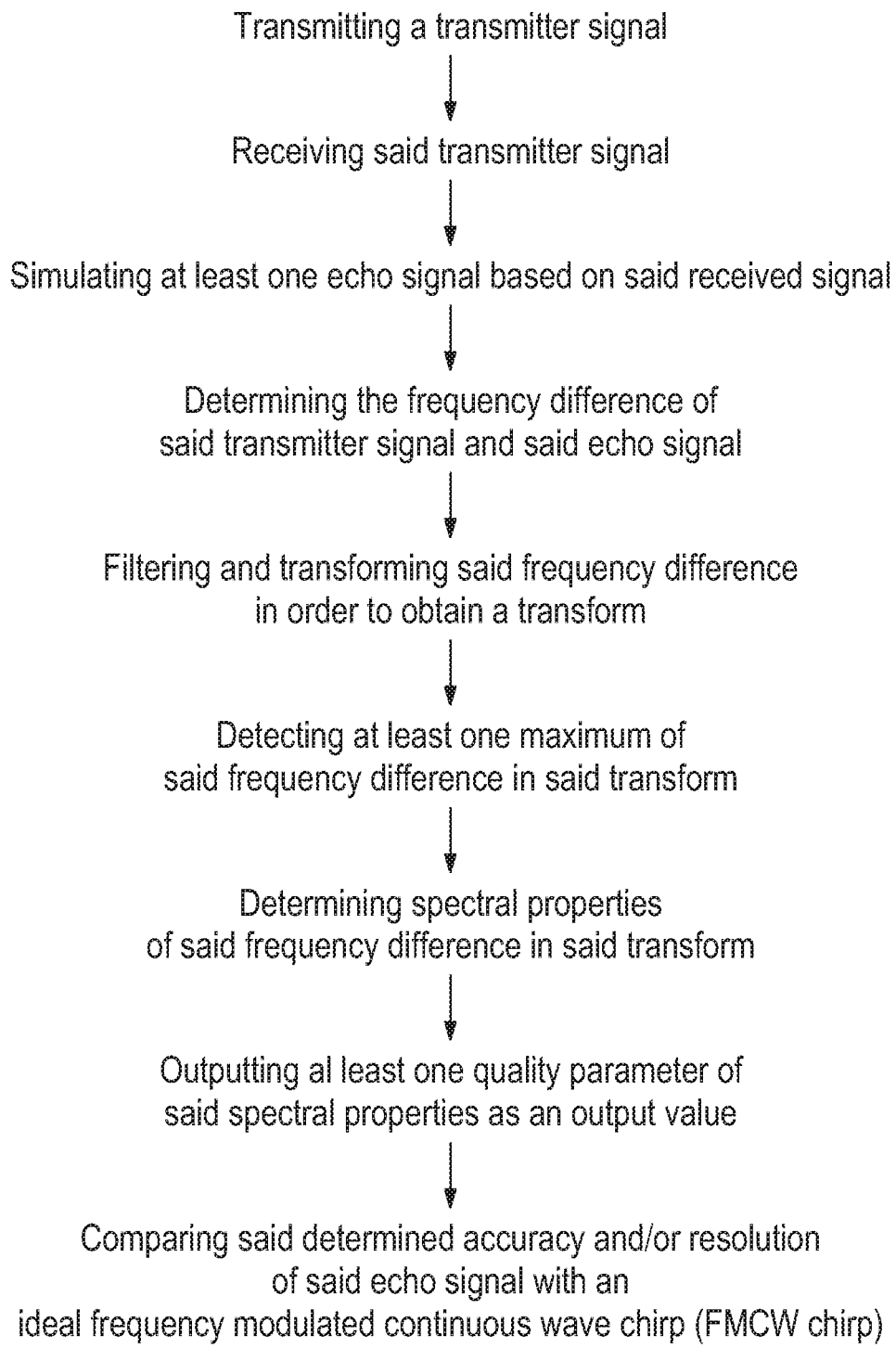
FIG. 2 shows a flow-chart of a method for analyzing the resolution and/or the accuracy of a transmission unit of a radar sensor according to the invention.

In FIG. 2, a method for analyzing the resolution and/or the accuracy of the transmission unit 12 of the radar sensor 10 is shown in a flow-chart.

According to this Figure, a transmission unit 12 emits a transmitter signal which is typically used for measuring an object 18 by radar measurement, for instance an automotive object.

The transmitter signal may be reflected by the object 18 such that the receiving unit 14 receives a received signal being a reflected transmitter signal.

Alternatively, the receiving unit 14 is directly coupled to the transmission unit 12 such that the receiving unit 14 receives the transmitter signal directly, without any reflectance. This direct coupling is illustrated by the dashed connection line 20. In case a transceiver is used instead of a receiving unit 14 being separately formed with respect to the transmission unit 16, the connection line 20 is not necessary since both functions are provided in one unit.

Based on the received signal, the radar sensor 10, in particular the processing unit 16, simulates at least one (further) echo signal in order to measure and analyze the resolution and/or accuracy of the transmission unit 12 of the radar sensor 10 which are quality parameters of the spectral properties.

For simulating purposes, a time shift and/or a frequency shift are/is applied to the received signal. Thus, the measured transmitter signal is delayed, particularly runtime shifted, and/or frequency shifted, in particular Doppler shifted, in order to obtain the at least one echo signal.

Furthermore, the time, the frequency offset, the amplitude and/or the addition of noise are considered during the simulation of the at least one echo signal in order to obtain a realistic echo signal as it would appear when the transmitter signal is reflected by the object 18 to be detected.

In order to obtain a simulation being as realistic as possible, the simulated echo signal is virtually processed by at least one simulation of the processing unit which usually processes the reflected transmitter signals (received signals) which are received by the receiving unit 14.

In general, several different echo signals are simulated wherein different time shifts and/or frequency shifts are applied to the transmitter signal received by the receiving unit 14.

Afterwards, the frequency difference of the transmitter signal generated by the transmission unit 12 and the (simulated) echo signal is determined. Thus, the so called beat frequency is obtained being the frequency difference. The beat frequency is produced by down converting or down mixing the echo signal with the transmitter signal providing the instantaneous frequency.

Figure 3:
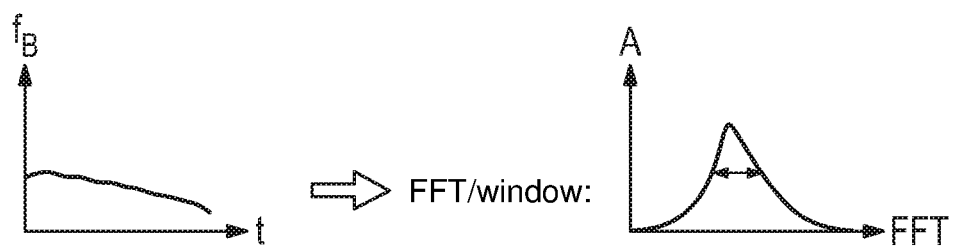
FIG. 3 shows a sketch illustrating several steps of the method according to the invention.

A spectrogram (frequency over time diagram) of such a frequency difference is shown in a sketch in FIG. 3 to which reference is made. In this sketch, the beat frequency is labeled by $f_B$.

As several different echo signals are simulated, several different frequency differences can be determined which are used for analyzing purposes of the transmission unit 12.

Afterwards, the obtained frequency difference (beat frequency) is filtered and transformed by applying a window function as well as a Fourier transformation, for instance. Thus, a transform of the beat frequency is generated which is used for further processing, particularly for determining the spectral properties of the frequency difference.

In general, the (Fourier) transform of the frequency difference (beat frequency) shows its (frequency) spectrum which is also shown in the sketch of FIG. 3.

Depending on the frequency difference, its spectrum has at least one maximum which can be detected automatically by the processing unit 16, for instance. Thus, the at least one maximum is provided in the (Fourier) transform of the frequency difference (beat frequency).

Further, the processing unit 16 automatically determines spectral properties of the frequency difference by analyzing the spectrum of the frequency difference, in particular its (Fourier) transform. The processing unit 16 analyzes the shape of the transform, for instance in order to obtain spectral properties such as full width at half maximum, also called half width, the amplitude, the distance between at least two maxima, the steepness, the standard deviation, the mean value and/or the deviation from a preset.

These parameters being the most important spectral properties can be determined automatically by analyzing the spectrum (Fourier transform) of the frequency deviation (beat frequency).

For instance, the simulated echo signal may have a certain frequency shift and/or a certain time shift in order to locate this shift at a certain position being of interest. Thus, the accuracy of the transmitter signal can be analyzed precisely at this certain point being of interest.

After the processing unit 16 has analyzed the frequency difference of the transmitter signal and the (simulated) echo signal(s) in order to obtain the spectral properties, at least one quality parameter of the transmission unit 12 is outputted as an output value. The quality parameter might be the resolution and/or the accuracy. Thus, the user of the radar sensor 10 easily recognizes if the transmission unit 12 has a good resolution and/or if the transmission unit 12 is accurate.

The quality parameter can be outputted in the unit of length, in particular as a length specification. Thus, the resolution and/or accuracy are/is provided in meter (m), centimeter (cm) or millimeter (mm).

In addition, the resolution and/or the accuracy obtained may be compared with the ones of an ideal frequency modulated continuous wave chirp (FMCW chirp) wherein the frequency differences (beat frequencies) are used for comparing purposes, in particular their transforms.

The processing unit 16 may be configured to decode the frequency difference in order to obtain information about the transmitter signal and/or the received signal which has been reflected by the object 18 before it has been received by the receiving unit 14.

As the method is applied to the transmitter signal based on which the at least one echo signal is simulated, it is ensured that the resolution and/or accuracy of the transmission unit 12 is determined in dependency of the transmitter signal.

Thus, the radar sensor 10, in particular the processing unit 16, is configured to output at least one quality parameter of spectral properties obtained by performing the method described above such as the accuracy and/or the resolution.

Furthermore, the receiving unit 14 may be provided outside the housing of the radar sensor 10 wherein a connecting line is provided for establishing a connection between the receiving unit 14 and the radar sensor 10, in particular the processing unit 16 of the radar sensor 10. Alternatively, the receiving unit 14 may be connected to a separate processing unit used for simulating the echo signals.

Accordingly, a radar sensor 10 and a method are provided for determining and outputting a quality parameter.

The invention claimed is:

1. A method for analyzing the resolution and/or the accuracy of a transmission unit of a radar sensor comprising:
   transmitting a transmitter signal via the transmission unit of the radar sensor,
   receiving the transmitter signal reflected from a target via a receiving unit;
   simulating at least one echo signal based on said received transmitter signal, the at least one simulated echo signal being produced by delaying and/or frequency shifting said received transmitter signal,
   determining a frequency difference of said received transmitter signal and said simulated echo signal, said frequency difference being a beat frequency,
   filtering and transforming said frequency difference in order to obtain a transform;
   detecting at least one maximum of said frequency difference in said transform;
   determining spectral properties of said frequency difference in said transform; and
   outputting at least one quality parameter of said spectral properties as an output value, said quality parameter indicating the quality of the transmission unit.

2. The method according to claim 1, wherein said simulated echo signal is processed with at least one simulation of a processing unit of said receiving unit.

3. The method according to claim 1, wherein several different echo signals are simulated and wherein different several frequency differences are determined for said several different echo signals simulated.

4. The method according to claim 1, wherein said transmission unit and said receiving unit are housed in said radar sensor.

5. The method according to claim 1, wherein a resolution and/or an accuracy of the transmission unit are or is analyzed depending on said transmitter signal.

6. The method according to claim 1, wherein the time, the frequency offset, the amplitude and/or the addition of noise are considered during the simulation.

7. The method according to claim 1, wherein said simulated echo signal is mixed down by said transmitter signal in order to obtain said frequency difference.

8. The method according to claim 1, wherein said spectral properties comprise the full width at half maximum, the amplitude, the distance between at least two maxima, the steepness, the standard deviation, the mean value and/or the deviation from a preset.

9. The method according to claim 1, wherein said simulated echo signal is preset as a position setting for the frequency difference.

10. The method according to claim 1, wherein a processing unit decodes said frequency difference.

11. The method according to claim 1, wherein said output value is a length specification.

12. The method according to claim 1, wherein an accuracy and/or a resolution of said simulated echo signal is compared with an ideal frequency modulated continuous wave chirp.

13. A radar sensor comprising a receiving unit, a transmission unit and a processing unit, said transmission unit being configured to transmit a transmitter signal, said receiving unit being configured to receive said transmitter signal transmitted by said transmitter unit and reflected from a target and said processing unit being configured to simulate at least one echo signal based on said received signal by delaying and/or frequency shifting said received transmitter signal, said processing unit being configured to determine a frequency difference of said received transmitter signal and said simulated echo signal, said frequency difference being a beat frequency difference in order to obtain a transform, said processing unit being configured to detect at least one maximum of said frequency difference in said transform, said processing unit being configured to determine spectral properties of said frequency difference in said transform, and wherein said processing unit is configured to output at least one quality parameter of said spectral properties as an output valve, said quality parameter indicating the quality of said transmission unit.

14. The radar sensor according to claim 13, wherein said radar sensor is at least part of a continuous wave radar system.

15. A method for analyzing the resolution and/or the accuracy of a transmission unit of a radar sensor comprising the following steps:
   transmitting a transmitter signal via the transmission unit of the radar sensor,
   receiving the transmitter signal reflected from a target via a receiving unit,
   simulating at least one echo signal based on said received transmitter signal, the at least one simulated echo signal being produced by delaying and/or frequency shifting said received transmitter signal,
   determining a frequency difference of said received transmitter signal and said simulated echo signal, said frequency difference being a beat frequency,
   filtering and transforming said frequency difference in order to obtain a transform,
   detecting at least one maximum of said frequency difference in said transform,
   determining spectral properties of said frequency difference in said transform, and
   outputting at least one quality parameter of said spectral properties as an output value, the output value corresponding to resolution and/or accuracy of the transmission unit.

* * * * *